United States Patent
Kaneko et al.

(10) Patent No.: US 10,879,045 B2
(45) Date of Patent: Dec. 29, 2020

(54) PLASMA PROCESSING APPARATUS

(71) Applicant: Tokyo Electron Limited, Tokyo (JP)

(72) Inventors: Kazushi Kaneko, Miyagi (JP); Koji Koyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 297 days.

(21) Appl. No.: 15/285,587

(22) Filed: Oct. 5, 2016

(65) Prior Publication Data

US 2017/0103874 A1 Apr. 13, 2017

(30) Foreign Application Priority Data

Oct. 9, 2015 (JP) .................................. 2015-200878

(51) Int. Cl.
*H01J 37/32* (2006.01)

(52) U.S. Cl.
CPC .. *H01J 37/32229* (2013.01); *H01J 37/32192* (2013.01); *H01J 37/32201* (2013.01); *H01J 37/32266* (2013.01); *H01J 37/32302* (2013.01); *H01J 37/32311* (2013.01); *H01J 37/32935* (2013.01); *H01J 2237/327* (2013.01)

(58) Field of Classification Search
USPC ............................. 118/723 MW; 156/345.41
See application file for complete search history.

(56) References Cited

U.S. PATENT DOCUMENTS

| | | | | |
|---|---|---|---|---|
| 4,777,336 A | * | 10/1988 | Asmussen | G01R 27/2635 219/696 |
| 5,049,843 A | * | 9/1991 | Barnes | H01J 37/32192 315/39 |
| 5,311,103 A | * | 5/1994 | Asmussen | C23C 16/505 118/723 R |
| 2005/0030003 A1 | * | 2/2005 | Strang | H01J 37/32192 324/101 |
| 2005/0034815 A1 | * | 2/2005 | Kasai | H01J 37/32192 156/345.41 |

(Continued)

FOREIGN PATENT DOCUMENTS

| | | |
|---|---|---|
| EP | 2 573 798 A2 | 3/2013 |
| JP | 2000-031073 A | 1/2000 |

(Continued)

OTHER PUBLICATIONS

English Machine Translation JP2007028387, Tsugami et al (Year: 2007).*

*Primary Examiner* — Rakesh K Dhingra
(74) *Attorney, Agent, or Firm* — Pearne & Gordon LLP (57) ABSTRACT

Detection accuracy of a power of a progressive wave and detection accuracy of a power of a reflection wave can be improved. In a plasma processing apparatus, a first directional coupler is provided in a first waveguide which is configured to connect a microwave generating unit and a first port of a circulator. A first detector is connected to the first directional coupler. A second port of the circulator is connected to a plasma generating unit via a second waveguide. Further, a second directional coupler is provided in a third waveguide which is configured to connect a third port of the circulator and a dummy load. A second detector is connected to the second directional coupler.

1 Claim, 5 Drawing Sheets

(56) References Cited

U.S. PATENT DOCUMENTS

| | | | |
|---|---|---|---|
| 2006/0124244 A1* | 6/2006 | Ishii | H01J 37/32192 156/345.42 |
| 2010/0296977 A1* | 11/2010 | Hancock | A61L 2/0011 422/186 |
| 2011/0114115 A1* | 5/2011 | Srivastava | H01J 37/32192 134/1.2 |
| 2014/0225504 A1* | 8/2014 | Kaneko | H01J 37/32192 315/111.21 |
| 2015/0007940 A1* | 1/2015 | Kaneko | H01J 37/32302 156/345.41 |
| 2015/0022086 A1 | 1/2015 | Kaneko | |

FOREIGN PATENT DOCUMENTS

| | | |
|---|---|---|
| JP | 2007028387 * | 2/2007 |
| JP | 2009-036199 A | 2/2009 |
| JP | 2014-154421 A | 8/2014 |
| JP | 2014-520663 A | 8/2014 |
| WO | 2013/003164 A2 | 1/2013 |

\* cited by examiner

PLASMA PROCESSING APPARATUS

CROSS-REFERENCE TO RELATED APPLICATION

This application claims the benefit of Japanese Patent Application No. 2015-200878 filed on Oct. 9, 2015, the entire disclosures of which are incorporated herein by reference.

TECHNICAL FIELD

The embodiments described herein pertain generally to a plasma processing apparatus.

BACKGROUND

In the manufacture of an electronic device, a plasma processing apparatus is used to process a substrate. Generally, the plasma processing apparatus is equipped with a processing vessel and a high frequency wave generating unit. In the plasma processing apparatus, a processing gas is supplied into the processing vessel, and the processing gas is excited by energy of a high frequency wave from the high frequency wave generating unit.

In this plasma processing apparatus, the high frequency wave generated by the high frequency wave generating unit needs to be sufficiently used in generating plasma. To this end, a power of a progressive wave and a power of a reflection wave of the high frequency wave need to be detected. In order to detect the power of the progressive wave and the power of the reflection wave, there is proposed a plasma processing apparatus equipped with a circulator, a directional coupler, a first detector and a second detector, as described in Patent Document 1.

The circulator is provided between a high frequency wave generating unit and a load, and is configured to transmit a progressive wave from the high frequency wave generating unit toward the load and couple a reflection wave from the load to a dummy load. The directional coupler is provided in a waveguide between the circulator and the load. The directional coupler is configured to output, from a first output thereof, a part of the progressive wave propagating in the waveguide and output, from a second output thereof, a part of the reflection wave propagating in the waveguide. The first detector is configured to detect a power of the high frequency wave output from the first output of the directional coupler, and the second detector is configured to detect a power of the high frequency wave output from the second output of the directional coupler.

Further, the high frequency wave used in the plasma processing apparatus disclosed in Patent Document 1 is a high frequency wave of a VHF band. The configuration of the plasma processing apparatus described in Patent Document 1, that is, the circulator, the directional coupler, the first detector and the second detector are also applicable to a plasma processing apparatus using a microwave as the high frequency wave.

Patent Document 1: Japanese Patent Laid-open Publication No. 2000-031073

In the plasma processing apparatus using the microwave, it is difficult for the directional coupler to completely separate the progressive wave and the reflection wave. That is, a microwave including the reflection wave as well as the progressive wave is output from the first output of the directional coupler, and a microwave including the progressive wave as well as the reflection wave is output from the second output of the directional coupler. Accordingly, it is difficult that the power of the progressive wave and the power of the reflection wave are individually detected with high accuracy. From this background, it is required to improve detection accuracy of the power of the progressive wave and detection accuracy of the power of the reflection wave.

SUMMARY

In one exemplary embodiment, a plasma processing apparatus includes a processing vessel, a microwave generating unit, a plasma generating unit, a circulator, a first waveguide, a second waveguide, a third waveguide, a first directional coupler, a first detector, a second directional coupler, and a second detector. The microwave generating unit is configured to generate a microwave. The plasma generating unit is configured to generate plasma within the processing vessel with the microwave. The circulator has a first port, a second port and a third port, and is configured to output the microwave received through the first port to the second port and output the microwave received through the second port to the third port. The first waveguide is configured to connect the microwave generating unit and the first port. The second waveguide is configured to connect the second port and the plasma generating unit. The third waveguide is configured to connect the third port and a dummy load. The first directional coupler is provided in the first waveguide, and is configured to output a part of the microwave which is propagated from the microwave generating unit to the first port, that is, a part of a progressive wave. The first detector is connected to the first directional coupler, and is configured to detect a power of the part of the progressive wave. The second directional coupler is provided in the third waveguide, and is configured to output a part of the microwave which is propagated from the third port to the dummy load, that is, a part of a reflection wave. The second detector is connected to the second directional coupler, and is configured to detect a power of the part of the reflection wave.

In this plasma processing apparatus, since the circulator is provided between the first waveguide and the second waveguide, the reflection wave is suppressed from being propagated from the second waveguide into the first waveguide. Further, since the reflection wave propagated from the second waveguide to the third waveguide is absorbed by the dummy load, the reflection wave is suppressed from being propagated from the third waveguide into the first waveguide. Since the first detector detects the power of the microwave from the first directional coupler which is provided in the first waveguide, detection accuracy of the power of the progressive wave is improved. Further, in this plasma processing apparatus, the progressive wave from the first waveguide is suppressed from being propagated into the third waveguide by the circulator. Since the second detector detects the power of the microwave from the second directional coupler which is provided in the third waveguide, detection accuracy of the reflection wave is improved.

In the exemplary embodiment, the microwave generating unit may generate, as a microwave, a microwave (hereinafter, referred to as "high-bandwidth microwave") including multiple frequency components having different frequencies belonging to a preset frequency band. In general, the directional coupler is configured to separate a progressive wave and a reflection wave of a certain frequency. Thus, in case that the microwave generating unit generates the high-bandwidth microwave, it is difficult for the directional coupler to completely separate the progressive wave and the reflection wave of the high-bandwidth microwave. Therefore, the above-described configuration in which the first directional coupler is provided in the first waveguide and the second directional coupler is provided in the third waveguide is particularly effective in the case where the microwave generating unit generates the high-bandwidth microwave.

According to the exemplary embodiments as described above, in the plasma processing apparatus configured to generate plasma with a microwave, detection accuracy of a power of a progressive wave and detection accuracy of a power of a reflection wave can be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 1:
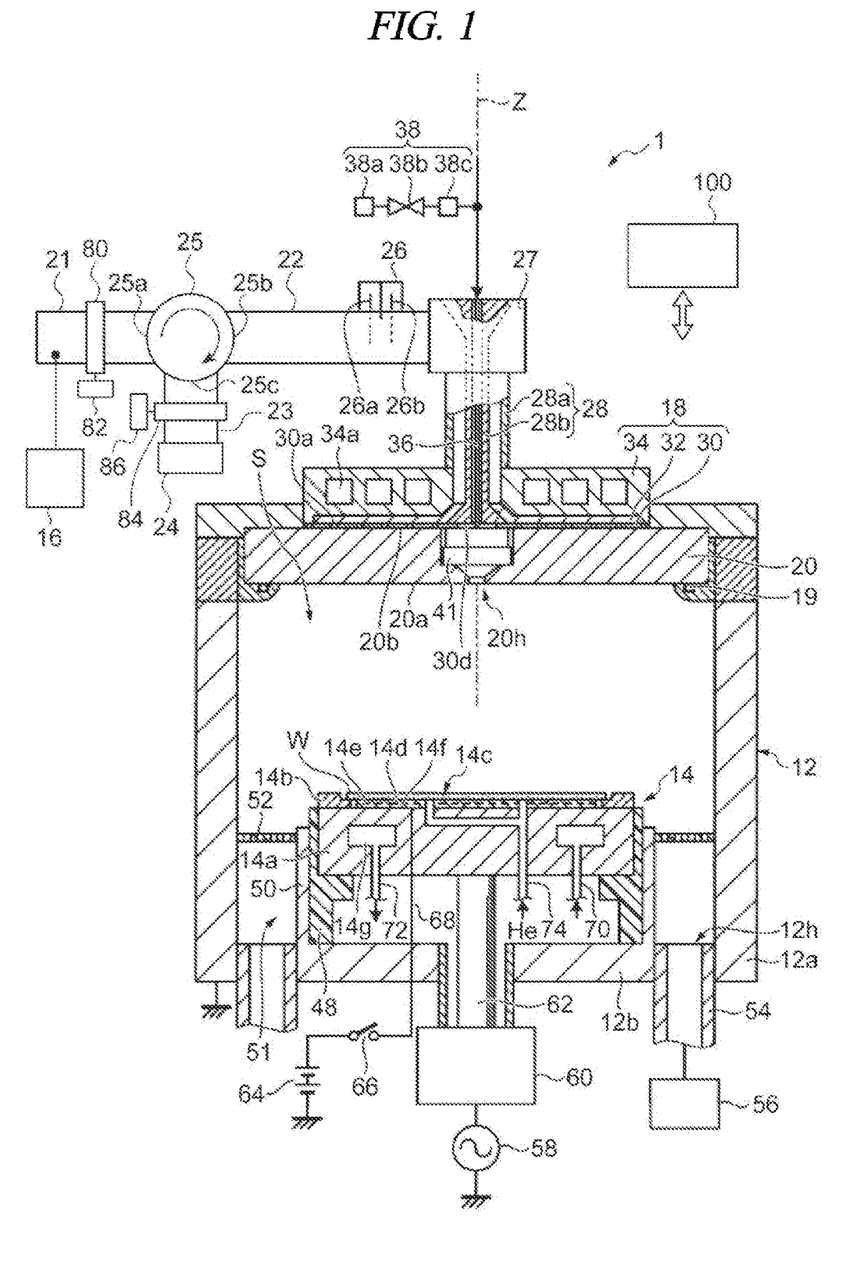
FIG. 1 is a diagram illustrating a plasma processing apparatus according to an exemplary embodiment.

FIG. 1 is a diagram illustrating a plasma processing apparatus according to an exemplary embodiment. The plasma processing apparatus 1 shown in FIG. 1 includes a processing vessel 12, a stage 14, a microwave generating unit 16, an antenna 18 and a dielectric window 20.

The processing vessel 12 is provided with a processing space S therein. The processing vessel 12 has a sidewall 12a and a bottom portion 12b. The sidewall 12a is formed to have a substantially cylindrical shape. A central axis line of the sidewall 12a substantially coincides with an axis line Z which is extended in a vertical direction. The bottom portion 12b is provided at a lower end side of the sidewall 12a. An exhaust hole 12h for gas exhaust is formed at the bottom portion 12b. An upper end portion of the sidewall 12a is opened.

The dielectric window 20 is disposed on the upper end portion of the sidewall 12a. The dielectric window 20 has a bottom surface 20a which faces the processing space S. The dielectric window 20 closes the opening of the upper end portion of the sidewall 12a. An O-ring 19 is provided between the dielectric window 20 and the upper end portion of the sidewall 12a. The processing vessel 12 is hermetically sealed by the O-ring 19 more securely.

The stage 14 is accommodated in the processing space S. The stage 14 is provided to face the dielectric window 20 in the vertical direction. Further, the stage 14 is disposed such that the processing space S is formed between the dielectric window 20 and the stage 14. The stage 14 is configured to support a substrate W placed thereon.

In the exemplary embodiment, the stage 14 includes a base 14a, a focus ring 14b and an electrostatic chuck 14c. The base 14a has a substantially disk shape, and is made of a conductive material such as aluminum. A central axis line of the base 14a substantially coincides with the axis line Z. The base 14a is supported by a cylindrical supporting member 48. The cylindrical supporting member 48 is made of an insulating material, and is vertically extended upwards from the bottom portion 12b. A conductive cylindrical supporting member 50 is provided on an outer periphery of the cylindrical supporting member 48. The cylindrical supporting member 50 is extended vertically upwards from the bottom portion 12b of the processing vessel 12 along the outer periphery of the cylindrical supporting member 48. An annular exhaust path 51 is formed between the cylindrical supporting member 50 and the sidewall 12a.

A baffle plate 52 is provided in an upper portion of the exhaust path 51. The baffle plate 52 has an annular shape. The baffle plate 52 is provided with through holes which are formed through the baffle plate 52 in a plate thickness direction. The aforementioned exhaust hole 12h is formed under the baffle plate 52. The exhaust hole 12h is connected to an exhaust device 56 via an exhaust line 54. The exhaust device 56 has an automatic pressure control valve (APC) and a vacuum pump such as a turbo molecular pump. The processing space S can be decompressed to a required vacuum level by the exhaust device 56.

The base 14a is configured to serve as a high frequency electrode. The base 14a is electrically connected to a high frequency power supply 58 for RF bias via a power feed rod 62 and a matching unit 60. The high frequency power supply 58 is configured to output a high frequency power having a preset frequency of, e.g., 13.56 MHz, suitable for controlling energy of ions attracted into the substrate W (hereinafter, appropriately referred to as "bias power") at a set power level. The matching unit 60 incorporates therein a matching device configured to match an impedance of the high frequency power supply 58 and an impedance at a load side such as, mainly, an electrode, plasma and the processing vessel 12. A blocking capacitor for self-bias generation is included in the matching device.

An electrostatic chuck 14c is provided on a top surface of the base 14a. The electrostatic chuck 14c is configured to attract and hold the substrate W by an electrostatic attracting force. The electrostatic chuck 14c includes an electrode 14d, an insulating film 14e and an insulating film 14f, and has a substantially disk shape. A central axis line of the electrostatic chuck 14c substantially coincides with the axis line Z. The electrode 14d of the electrostatic chuck 14c is made of a conductive film, and is provided between the insulating film 14e and the insulating film 14f. The electrode 14d is electrically connected to a DC power supply 64 via a switch 66 and a coated line 68. The electrostatic chuck 14c is capable of attracting and holding the substrate W by a Coulomb force which is generated by a DC voltage applied from the DC power supply 64.

A coolant path 14g is provided within the base 14a. For example, the coolant path 14g is formed to be extended around the axis line Z. A coolant from a chiller unit is supplied into the coolant path 14g through a pipeline 70. The coolant supplied into the coolant path 14g is returned back into the chiller unit via a pipeline 72. By controlling a temperature of the coolant by the chiller unit, a temperature of the electrostatic chuck 14c and, ultimately, a temperature of the substrate W is controlled.

Further, the stage 14 is provided with a gas supply line 74. The gas supply line 74 is provided to supply a heat transfer gas, e.g., a He gas into a gap between a top surface of the electrostatic chuck 14c and a rear surface of the substrate W.

The microwave generating unit 16 is configured to generate a microwave for exciting a processing gas supplied into the processing vessel 12. In the exemplary embodiment, the microwave generating unit 16 generates a high-bandwidth microwave. The high-bandwidth microwave contains a multiple number of frequency components having different frequencies belonging to a preset frequency band around a preset center frequency. Further, the microwave generating unit 16 may be configured to generate a microwave having a single frequency of, e.g., 2.45 GHz.

The plasma processing apparatus 1 further includes a first waveguide 21, a second waveguide 22, a third waveguide 23, a dummy load 24, a circulator 25, a tuner 26, a mode converter 27 and a coaxial waveguide 28. The microwave generating unit 16 is connected to the mode converter 27 via the first waveguide 21, the circulator 25 and the second waveguide 22.

The first waveguide 21 has, for example, a rectangular shape, and is connected to the microwave generating unit 16. Further, the first waveguide 21 is also connected to the circulator 25. The circulator 25 is provided with a first port 25a, a second port 25b and a third port 25c. The circulator 25 is configured to output the microwave received through the first port 25a to the second port 25b and output the microwave received through the second port 25b to the third port 25c. The first waveguide 21 connects the first port 25a of the circulator 25 and the microwave generating unit 16.

The second waveguide 22 has, for example, a rectangular shape, and connects the second port 25b of the circulator 25 and a plasma generating unit to be described later via the mode converter 27 and the coaxial waveguide 28. The third waveguide 23 has, for example, a rectangular shape, and connects the third port 25c of the circulator 25 and the dummy load 24. The dummy load 24 receives and absorbs the microwave which propagates within the third waveguide 23. For example, the dummy load 24 converts the energy of the microwave to heat. By using this dummy load 24, the microwave which propagates within the third waveguide 23 from the third port 25c of the circulator 25 is substantially not reflected but absorbed by the dummy load 24.

The tuner 26 is provided in the second waveguide 22. The tuner 26 is equipped with a movable plate 26a and a movable plate 26b. Each of the movable plate 26a and the movable plate 26b is configured to adjust a protruding amount thereof toward an internal space of the second waveguide 22. The tuner 26 is configured to match an impedance of the microwave generating unit 16 and an impedance at a load side, e.g., the processing vessel 12, by adjusting the protruding amount of each of the movable plate 26a and the movable plate 26b with respect to a reference position.

The mode converter 27 is configured to convert a mode of the microwave transmitted from the second waveguide 22, and configured to supply the mode-converted microwave to the coaxial wave guide 28. The coaxial waveguide 28 includes an outer conductor 28a and an inner conductor 28b. The outer conductor 28a has a substantially cylindrical shape, and a central axis line thereof substantially coincides with the axis line Z. The inner conductor 28b has a substantially cylindrical shape, and is extended within the outer conductor 28a. A central axis line of the inner conductor 28b substantially coincides with the axis line Z. The coaxial waveguide 28 is configured to guide the microwave from the mode converter 27 to the antenna 18.

The antenna 18 is disposed on a surface 20b of the dielectric window 20 which is opposite from the bottom surface 20a thereof. The antenna 18 is equipped with a slot plate 30, a dielectric plate 32 and a cooling jacket 34.

The slot plate 30 is disposed on the surface 20b of the dielectric window 20. The slot plate 30 is made of a conductive metal, and has a substantially disk shape. A central axis line of the slot plate 30 substantially coincides with the axis line Z. The slot plate 30 is provided with multiple slot holes 30a. As an example, the multiple slot holes 30a constitute multiple slot pairs. Each slot pair includes two slot holes 30a which have substantially long hole shapes elongated in directions intersecting each other. The slot pairs are arranged along one or more concentric circles around the axis line Z. Further, a through hole 30d through which a pipe 36 to be described later can be inserted is formed at a central portion of the slot plate 30.

The dielectric plate 32 is disposed on the slot plate 30. The dielectric plate 32 is made of a dielectric material such as quartz, and has a substantially disk shape. A central axis line of the dielectric plate 32 substantially coincides with the axis line Z. The cooling jacket 34 is disposed on the dielectric plate 32. The dielectric plate 32 is provided between the cooling jacket 34 and the slot plate 30.

A surface of the cooling jacket 34 has electric conductivity. A flow path 34a is formed within the cooling jacket 34. A coolant is supplied into the flow path 34a. A lower end of the outer conductor 28a is electrically connected to a top surface of the cooling jacket 34, and a lower end of the inner conductor 28b is electrically connected to the slot plate 30 through holes formed at the central portions of the dielectric plate 32 and the cooling jacket 34.

The microwave from the coaxial waveguide 28 is propagated within the dielectric plate 32, and is supplied to the dielectric window 20 from the multiple slot holes 30a of the slot plate 30. The microwave supplied to the dielectric window 20 is introduced into the processing space S. The dielectric window 20 and the antenna 18 constitute the plasma generating unit.

The pipe 36 is inserted within an inner hole of the inner conductor 28b of the coaxial waveguide 28. Further, as mentioned above, the through hole 30d through which the pipe 36 can be inserted is formed at the central portion of the slot plate 30. The pipe 36 is extended through the inner hole of the inner conductor 28b, and is connected to a gas supply system 38.

The gas supply system 38 is configured to supply a processing gas for processing the substrate W into the pipe 36. The gas supply system 38 may include a gas source 38a, a valve 38b and a flow rate controller 38c. The gas source 38a is a source of the processing gas. The valve 38b is configured to switch a supply of the processing gas from the gas source 38a and a stop of the supply of the processing gas. The flow rate controller 38c is implemented by, for example, a mass flow controller, and is configured to adjust a flow rate of the processing gas from the gas source 38a.

The plasma processing apparatus 1 may further include an injector 41. The injector 41 is configured to supply the gas from the pipe 36 into a through hole 20h formed at the dielectric window 20. The gas supplied into the through hole 20h of the dielectric window 20 is then supplied into the processing space S. The processing gas is excited by the microwave which is introduced into the processing space S from the dielectric window 20. As a result, plasma is generated within the processing space S, and the substrate W is processed by active species such as ions and/or radicals in the plasma.

Figure 2:
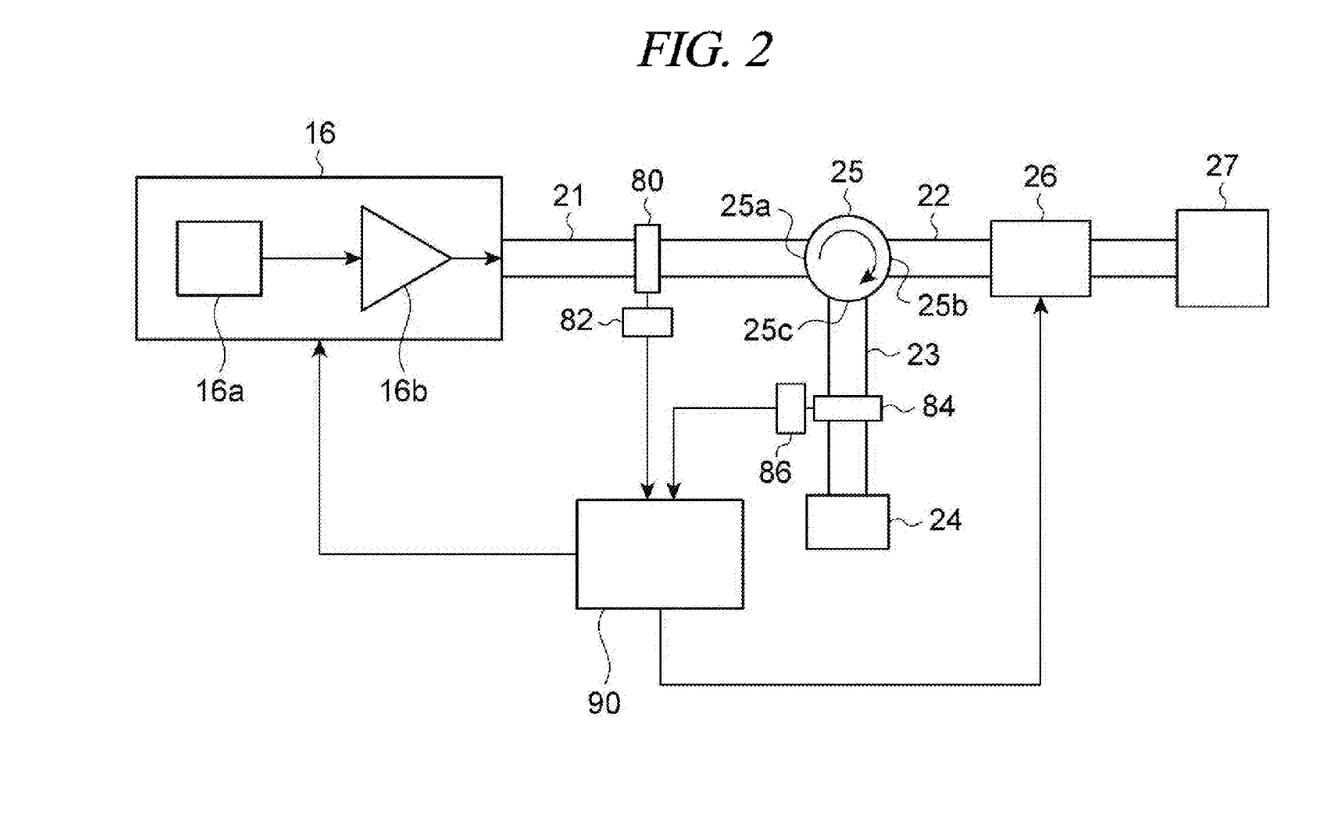
FIG. 2 is a diagram illustrating a microwave generating unit shown in FIG. 1 and components configured to propagate a microwave generated by the microwave generating unit.
Figure 3:
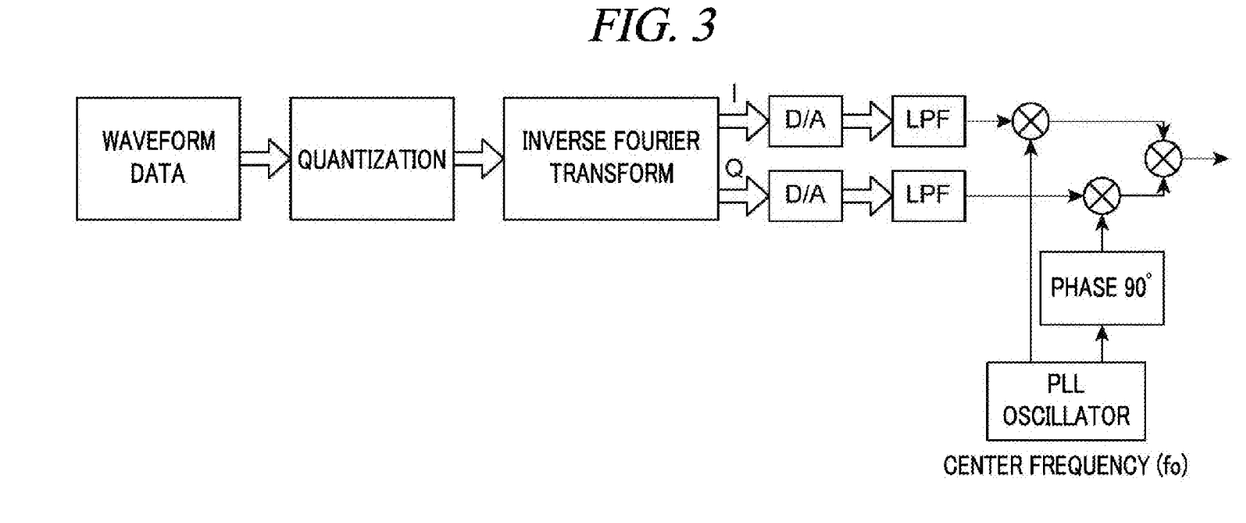
FIG. 3 is a diagram for describing a generation principle of a high-bandwidth microwave in the microwave generating unit.

Now, the microwave generating unit 16 configured to generate the high-bandwidth microwave will be discussed. FIG. 2 is a diagram illustrating the microwave generating unit shown in FIG. 1 and components configured to propagate the microwave generated by the microwave generating unit. FIG. 3 is a diagram for describing a generation principle of the high-bandwidth microwave in the microwave generating unit.

As depicted in FIG. 2, the microwave generating unit 16 is equipped with an oscillator 16a and an amplifier 16b. The oscillator 16a includes, for example, a PLL (Phase Locked Loop) oscillator configured to oscillate a microwave a phase of which is synchronized with a reference frequency; and an IQ digital converter connected to the PLL oscillator. The oscillator 16a sets a frequency of the microwave oscillated by the PLL oscillator as a center frequency. Further, the oscillator 16a generates, by using the IQ digital converter, multiple frequency components having different frequencies belonging to a set frequency band around the frequency of the microwave, i.e., the center frequency. In this way, the oscillator 16a generates a microwave having the multiple frequency components.

For example, the oscillator 16a may generate the microwave having the multiple frequency components by generating a continuous signal by performing inverse discrete Fourier transform on N number of complex data symbols. A method of generating this signal may be the same as an OFDMA (Orthogonal Frequency-Division Multiple Access) modulation method which is used in digital TV broadcasting or the like (see, for example, Japanese Patent No. 5,320,260). Further, the center frequency and the frequency band of the microwave generated by the microwave generating unit 16 are controlled by a main controller 100 to be described later.

As an example, as depicted in FIG. 3, the oscillator 16a has waveform data expressed by columns of previously digitized codes. The oscillator 16a separates I data and Q data from each other by quantizing the waveform data and by performing inverse Fourier transform. Further, the oscillator 16a obtains two analog signals by performing D/A (Digital/Analog) conversion of the I data and the Q data individually. The oscillator 16a then inputs these analog signals to a LPF (Low Pass Filter) which is configured to allow only a low frequency component to pass therethrough. Meanwhile, a microwave having phases different from each other at 90° is generated from the microwave having the center frequency fo which is output from the PLL oscillator. The oscillator 16a generates a microwave having multiple frequency components, that is, a high-bandwidth microwave by modulating the microwave having the phase difference of 90°, by using the analog signals output from the LPF. The high-bandwidth microwave has a center frequency of, e.g., 2.45 GHz and multiple frequency components of a pitch of 10 kHz within a bandwidth of 40 MHz. Further, by setting the phases of the adjacent frequency components to be orthogonal to each other (different from each other at a phase difference of 90°), a lot of the closest carrier waves can be arranged.

An output of the oscillator 16a is connected to an input of the amplifier 16b. Further, an output of the amplifier 16b is connected to the first waveguide 21. The amplifier 16b is configured to amplify the microwave input from the oscillator 16a and supply the amplified microwave to the first waveguide 21.

The microwave supplied to the first waveguide 21, that is, a progressive wave is supplied to the plasma generating unit via the circulator 25 and the second waveguide 22. Meanwhile, a microwave from the plasma generating unit, that is, a reflection wave reaches the dummy load 24 via the second waveguide 22 and the circulator 25, and then, is absorbed by the dummy load 24. As stated above, in the plasma processing apparatus 1, the reflection wave is substantially suppressed from being propagated into the first waveguide 21, and the progressive wave is substantially suppressed from being propagated into the third waveguide 23.

The first waveguide 21 is provided with a first directional coupler 80. The first directional coupler 80 is connected to a first detector 82. The first directional coupler 80 is configured to output a part of the microwave from the microwave generating unit 16, that is, the progressive wave. The first detector 82 is configured to detect a power of the part of the progressive wave output from the first directional coupler 80. Further, in case that the microwave generated by the microwave generating unit 16 is the high-bandwidth microwave, the first detector 82 is implemented by a spectrum detector. Accordingly, in case that the microwave generated by the microwave generating unit 16 is the high-bandwidth microwave, the first detector 82 detects powers of the aforementioned multiple frequency components, that is, a frequency spectrum of the progressive wave.

Figure 4:
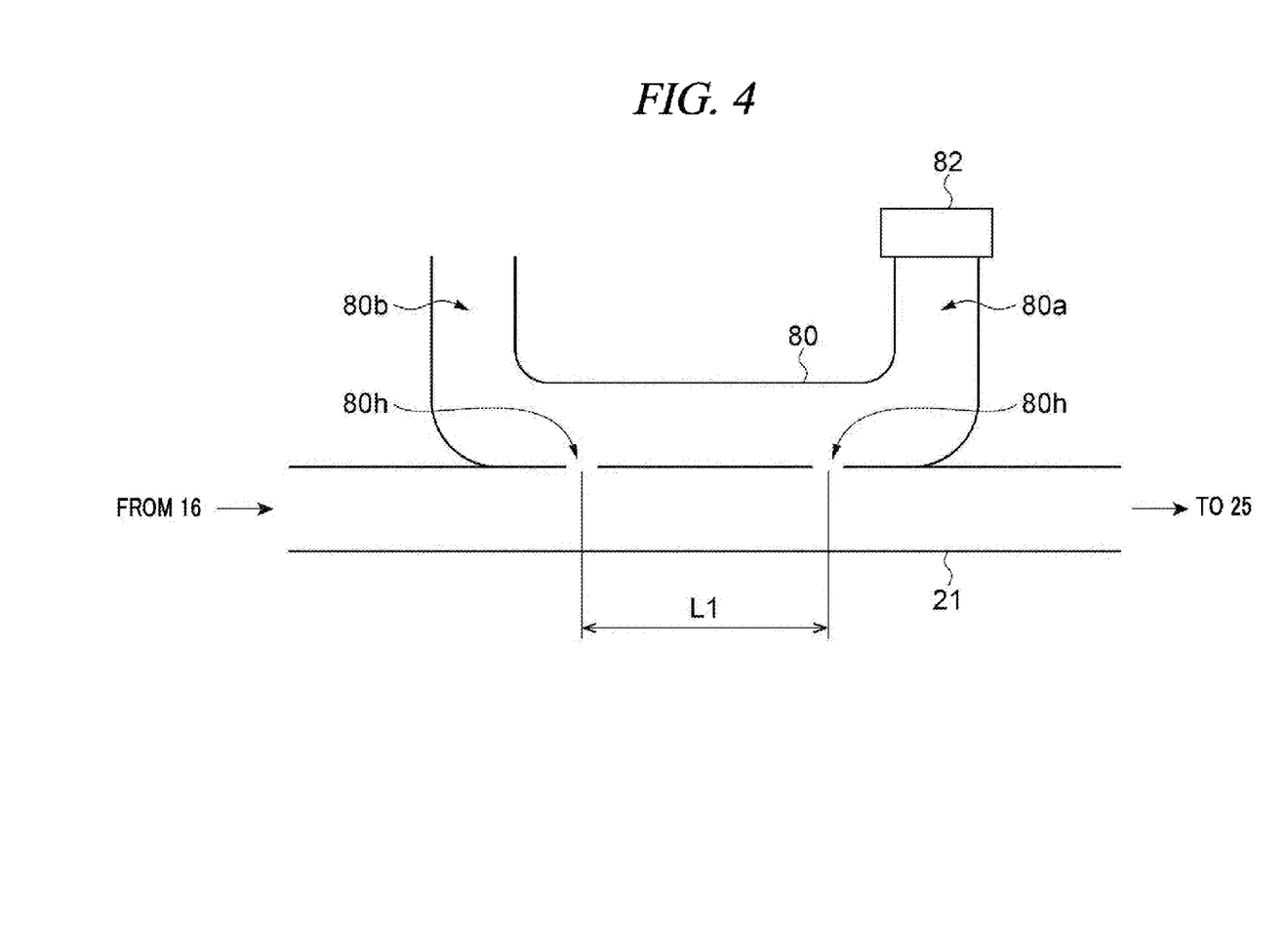
FIG. 4 is a diagram schematically illustrating a first directional coupler and a first detector.

FIG. 4 is a diagram schematically illustrating the first directional coupler and the first detector. As illustrated in FIG. 4, the first directional coupler 80 is implemented by a waveguide, and has a first output 80a and a second output 80b. Further, the first directional coupler 80 is connected to an internal space of the first waveguide 21 through a pair of holes 80h. A distance L1 between the pair of holes 80h is a fixed distance determined by design. Typically, the distance L1 is determined based on a wavelength λ which is defined by a center frequency of a used frequency range. By way of example, the distance L1 is λ/4. Here, in case that the microwave generating unit 16 generate a microwave having a single frequency, λ is a wavelength defined by this single frequency. Meanwhile, in case that the microwave generating unit 16 generates a high-bandwidth microwave, λ is a wavelength defined by the center frequency (or reference frequency) as stated above.

In the first directional coupler 80, a length of a path from the microwave generating unit 16 to the first output 80a through the first waveguide 21 and one of the pair of holes

80$h$ and a length of a path from the microwave generating unit 16 to the first output 80$a$ through the first waveguide 21 and the other of the pair of holes 80$a$ are substantially same. Accordingly, a microwave propagated from the microwave generating unit 16 toward the first output 80$a$ through the first waveguide 21 and one of the pair of holes 80$h$ and a microwave propagated from the microwave generating unit 16 toward the first output 80$a$ through the first waveguide 21 and the other of the pair of holes 80$h$ are mutually reinforced to be output from the first output 80$a$ as a part of a progressive wave propagated within the first waveguide 21.

Meanwhile, a path from the circulator 25 to the first output 80$a$ through the first waveguide 21 and one of the pair of holes 80$h$ and a path from the circulator 25 to the first output 80$a$ through the first waveguide 21 and the other of the pair of holes 80$a$ have a difference of $\lambda/2$ in the lengths thereof. Thus, even if a reflection wave is propagated into the first waveguide 21, the reflection wave is canceled almost completely at the first output 80$a$.

The microwave generated by the microwave generating unit 16 has a certain degree of frequency width even if it has a single wavelength. Further, in case that the microwave generated by the microwave generating unit 16 is the high-bandwidth microwave, the microwave has the multiple frequency components. Further, the distance L1 between the pair of holes 80$h$ of the first directional coupler 80 is set to be ¼ of $\lambda$, which is defined by the preset frequency, as stated above. Thus, if the frequency of the microwave is deviated from the preset frequency (e.g., center frequency), if the microwave has a frequency width or if the microwave is the high-bandwidth frequency, the microwave has a wavelength component deviated from the wavelength which defines the distance L1 between the pair of holes 80$h$. Thus, if the reflection wave is propagated into the first waveguide 21, a large reflection wave is propagated toward the first output 80$a$. Accordingly, the first directional coupler 80 cannot cancel the reflection wave at the first output 80$a$ completely.

Since, however, the circulator 25 is provided between the first waveguide 21 and the second waveguide 22, the reflection wave is suppressed from being propagated to the first waveguide 21 from the second waveguide 22. Further, since the reflection wave propagated from the second waveguide 22 to the third waveguide 23 is absorbed by the dummy load, the reflection wave is suppressed from being propagated to the first waveguide 21 from the third waveguide 23. Since the first directional coupler 80 is provided in the first waveguide 21 and the first detector 82 is connected to the first output 80$a$ of the first directional coupler 80, the first detector 82 is capable of detecting the power of the progressive wave with high accuracy.

Referring back to FIG. 2, a second directional coupler 84 is provided in the third waveguide 23. A second detector 86 is connected to the second directional coupler 84. The second directional coupler 84 is configured to output a part of the microwave propagated within the third waveguide 23 from the third port 25$c$ of the circulator 25 toward the dummy load 24, that is, the reflection wave. The second detector 86 is configured to detect a power of the part of the reflection wave output from the second directional coupler 84. Further, in case that the microwave generated by the microwave generating unit 16 is the high-bandwidth microwave, the second detector 86 is implemented by a spectrum detector. Accordingly, in case that the microwave generated by the microwave generating unit 16 is the high-bandwidth microwave, the second detector 86 detects powers of the aforementioned multiple frequency components, that is, a frequency spectrum of the reflection wave.

Figure 5:
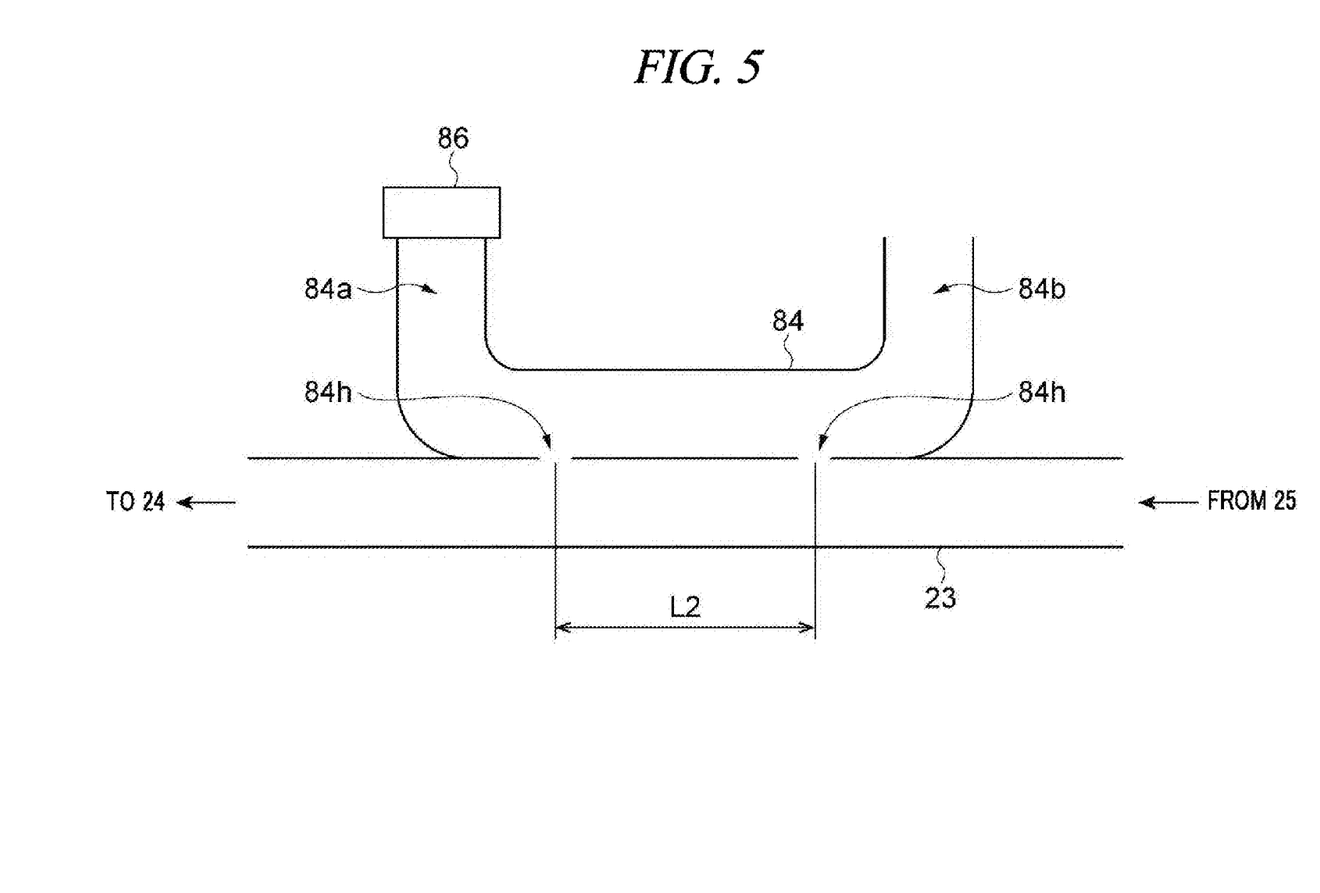
FIG. 5 is a diagram schematically illustrating a second directional coupler and a second detector.

FIG. 5 is a diagram schematically illustrating the second directional coupler and the second detector. As shown in FIG. 5, the second directional coupler 84 is implemented by a waveguide, and has a first output 84$a$ and a second output 84$b$. Further, the second directional coupler 84 is connected to an internal space of the third waveguide 23 through a pair of holes 84$h$. Like the distance L1, a distance L2 between the pair of holes 84$h$ is a fixed distance determined by design. Typically, the distance L2 is determined based on a wavelength $\lambda$ which is defined by a center frequency of a used frequency range. As an example, the distance L2 is $\lambda/4$.

A microwave propagated toward the first output 84$a$ through one of the pair of holes 84$h$ and a microwave propagated toward the first output 84$a$ through the other of the pair of holes 84$h$, which are propagated within the third waveguide 23 toward the dummy load 24, are mutually reinforced to be output as a part of a reflection wave propagated within the third waveguide 23.

Further, the progressive wave from the first waveguide 21 is suppressed from being propagated into the third waveguide 23 by the circulator 25. Since the second directional coupler 84 is provided in the third waveguide 23 and the second detector 86 is connected to the first output 84$a$ of the second directional coupler 84, the second detector 86 is capable of detecting the power of the reflection wave with high accuracy.

As shown in FIG. 2, the plasma processing apparatus 1 further includes a controller 90. The controller 90 is connected to the first detector 82, the second detector 86, the microwave generating unit 16 and the tuner 26. The controller 90 may include a processor such as a CPU (Central Processing Unit) and a storage unit. The controller 90 controls the microwave generating unit 16 and the tuner 26 by allowing the processor to execute a program stored in the storage unit. To elaborate, the controller 90 controls the power of the microwave generated by the microwave generating unit 16 according to the power (or frequency spectrum) of the progressive wave detected by the first detector 82 and the power (or frequency spectrum) of the reflection wave detected by the second detector 86. Furthermore, the controller 90 controls the tuner 26 to suppress the reflection wave according to the power (or frequency spectrum) of the reflection wave detected by the second detector 86. To be specific, the controller 90 controls the tuner 26 to adjust a protruding position of each of the movable plate 26$a$ and the movable plate 26$b$.

Moreover, as depicted in FIG. 1, the plasma processing apparatus 1 further includes the main controller 100. The main controller 100 controls an overall operation of the individual components of the plasma processing apparatus 1. The main controller 100 may include a processor such as a CPU, a user interface and a storage unit.

The processor controls overall operations of the individual components such as the microwave generating unit 16, the stage 14, the gas supply system 38 and the exhaust device 56 by executing a program and a process recipe stored in the storage unit.

The user interface includes a keyboard or a touch panel through which a process manager inputs a command or the like to manage the plasma processing apparatus 1; a display configured to visually display an operational status of the plasma processing apparatus 1; and so forth.

Control programs (software) for implementing various processes performed in the plasma processing apparatus 1 under the control of the processor, process recipes containing process condition data, and so forth are stored in the storage unit. When necessary, e.g., when there is an instruction from the user interface, the processor reads various control programs from the storage unit and executes the various control programs. Under such a control of the processor, a required process is performed in the plasma processing apparatus 1.

The plasma processing apparatus 1 described above has high detection accuracy of both the power of the progressive wave and the power of the reflection wave. Since the microwave generating unit 16 and the tuner 26 are controlled based on the power of the progressive wave and the power of the reflection wave that are detected with high accuracy, plasma can be generated stably, and it is possible to use the microwave generated by the microwave generating unit 16 efficiently and sufficiently in generating the plasma.

Furthermore, the first directional coupler 80 and the second directional coupler 84 are configured to separate the progressive wave and the reflection wave of the preset frequency (i.e., wavelength λ). In other words, it is difficult for the first directional coupler 80 and the second directional coupler 84 to completely separate the progressive wave and the reflection wave of a frequency different from the preset frequency (i.e., wavelength λ). Thus, the configuration in which the first directional coupler 80 is provided in the first waveguide 21 and the second directional coupler 84 is provided in the third waveguide 23 is especially effective in a case where the microwave generating unit 16 generates the high-bandwidth microwave.

In addition, in the plasma processing apparatus 1, even if a plasma process, in which a large reflection wave is generated, is performed, the progressive wave and the reflection wave do not interfere with each other. That is, in the plasma processing apparatus 1, the power of the progressive wave detected by the first detector 82 is hardly affected by the reflection wave, and the power of the reflection wave detected by the second detector 86 is hardly affected by the progressive wave. Thus, the plasma processing apparatus 1 is effective in performing a load control described in Japanese Patent Laid-open Publication No. 2014-154421 (Japanese Patent Application No. 2013-024145). To elaborate, in the plasma processing apparatus 1, it is possible to control the microwave generating unit 16 such that the power of the microwave supplied to the load is maintained constant according to a sum of the power of the progressive wave detected by the first detector 82 and a power (e.g., the power of the reflection wave) calculated based on the power of reflection wave detected by the second detector 86.

In the above, various exemplary embodiments are described. However, the exemplary embodiments are not limiting, and various changes and modifications may be made. By way of example, the aforementioned antenna 18 is nothing more than an example, and the above-described configuration for detecting the power of the progressive wave and the power of the reflection wave can be used in a plasma processing apparatus configured to generate a microwave by using any of various kinds of antennas.

Further, in the above-described exemplary embodiment, the first detector 82 and the second detector 86 are described to be spectrum detectors in case that the microwave generated by the microwave generating unit 16 is the high-bandwidth microwave. However, the first detector 82 and the second detector 86 may be configured to integrate the frequency spectrum.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A plasma processing apparatus, comprising:

a processing vessel;

a microwave generating unit configured to generate a microwave;

a plasma generating unit configured to generate plasma within the processing vessel with the microwave;

a circulator, having a first port, a second port and a third port, configured to output the microwave received through the first port to the second port and output the microwave received through the second port to the third port;

a first waveguide configured to connect the microwave generating unit and the first port;

a second waveguide configured to connect the second port and the plasma generating unit;

a tuner provided in the second waveguide, equipped with a first movable plate and a second movable plate, and configured to adjust a protruding amount of each of the first and second movable plates toward an internal space of the second waveguide;

a third waveguide provided between the third port and a dummy load;

a first directional coupler, connected to an internal space of the first waveguide through a pair of holes, configured to output a part of the microwave which is propagated from the microwave generating unit to the first port;

a first detector, connected to the first directional coupler, configured to detect a power of a progressive wave which is the part of the microwave output from the first directional coupler;

a second directional coupler, provided in the third waveguide, configured to output a part of the microwave which is propagated from the third port to the dummy load;

a second detector, connected to the second directional coupler, configured to detect a power of a reflection wave which is the part of the microwave output from the second directional coupler; and a controller including a processor connected to the first detector, the second detector, the microwave generating unit and the tuner, wherein the controller is configured to generate by using an IQ digital converter, the microwave including multiple frequency components having different frequencies belonging to a preset frequency band, and configured to set phases of adjacent frequency components to be orthogonal to each other, and wherein the controller is configured to control a power of the microwave generated by the microwave generating unit such that a power supplied to the plasma generating unit is maintained constant according to a sum of the power of the progressive wave detected by the first detector and the power of the reflection wave detected by the second detector, and control the tuner to adjust the protruding amount of each of the first and second movable plates according to the power of the reflection wave detected by the second detector.

* * * * *